(12) United States Patent
Hagberg et al.

(10) Patent No.: US 6,542,529 B1
(45) Date of Patent: Apr. 1, 2003

(54) FOLDED CAVITY, BROAD AREA LASER SOURCE

(75) Inventors: Mats Hagberg, Västra Frölunda (SE); Robert J. Lang, San Jose, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/495,208

(22) Filed: Feb. 1, 2000

(51) Int. Cl.⁷ .............................. H01S 5/00; H01S 3/081
(52) U.S. Cl. ........................................... 372/46; 372/93
(58) Field of Search ................................ 372/93, 43–50

(56) References Cited

U.S. PATENT DOCUMENTS

| | | |
|---|---|---|
| 4,251,780 A | 2/1981 | Scifres et al. .................. 372/46 |
| 4,719,634 A * | 1/1988 | Streifer et al. ................. 372/46 |
| 4,853,936 A * | 8/1989 | Matsui et al. .................. 372/45 |
| 5,953,357 A * | 9/1999 | Hirata et al. ................... 372/46 |

* cited by examiner

Primary Examiner—Quyen Leung
(74) Attorney, Agent, or Firm—Allen, Dyer, Doppelt, Milbrath & Gilchrist, P.A.

(57) ABSTRACT

A broad stripe semiconductor laser has a folded cavity that permits the laser to produce output powers into a high quality beam with low divergence. The folded cavity includes a first material region disposed within the cavity having a first refractive index and a second material region having a second refractive index less than the first refractive index, and forming a first interface with the first material region. The first interface is disposed to reflect a lowest order reflection mode light beam propagating within the first material region. The first interface is disposed at a predetermined angle so that the lowest order reflection mode intracavity light beam is incident on the first interface at an angle below the critical total internal reflection angle, and higher order reflection modes are incident on the first interface at angles in excess of the total internal reflection critical angle. The interface may be curved to control the divergence to the light emitted from the cavity.

28 Claims, 9 Drawing Sheets

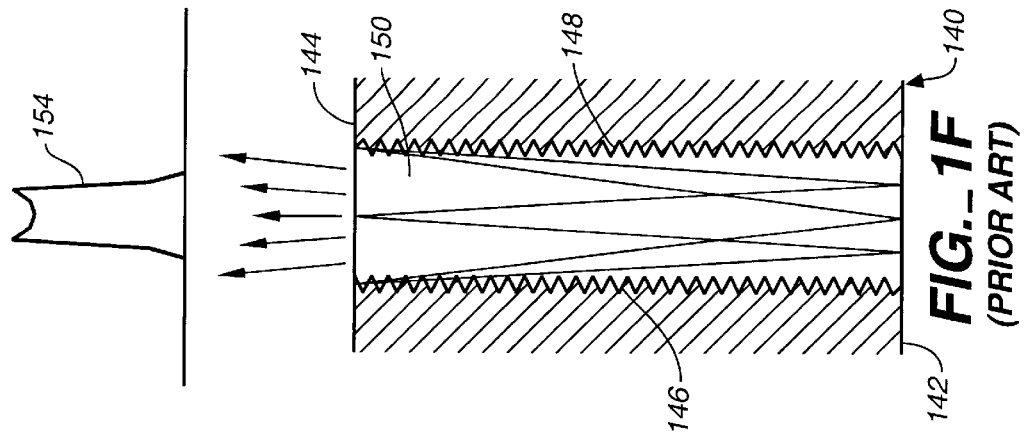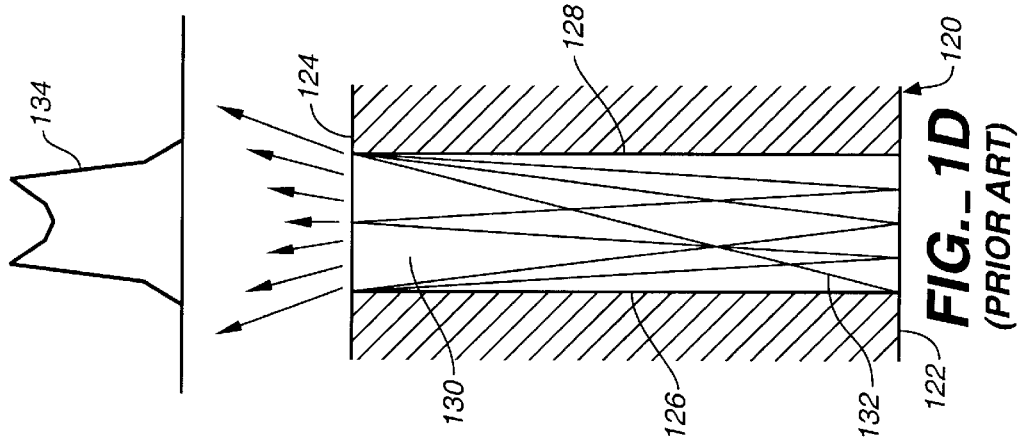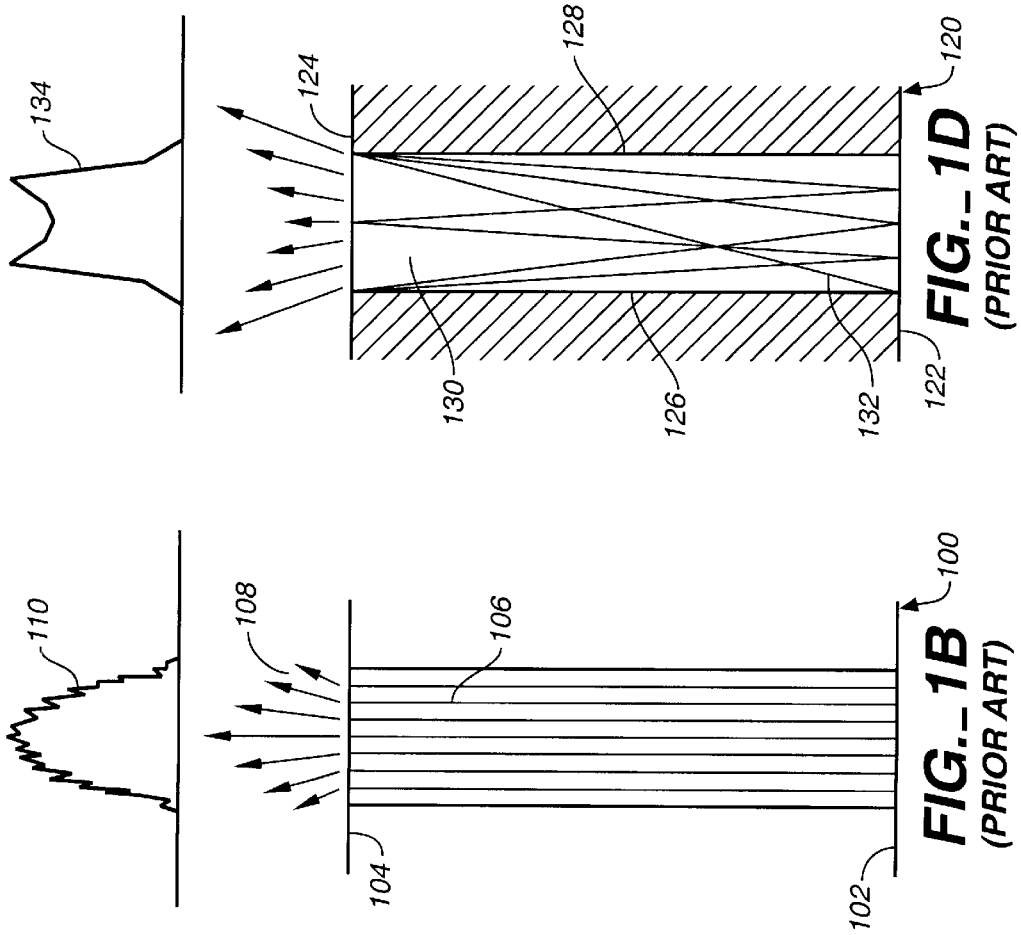

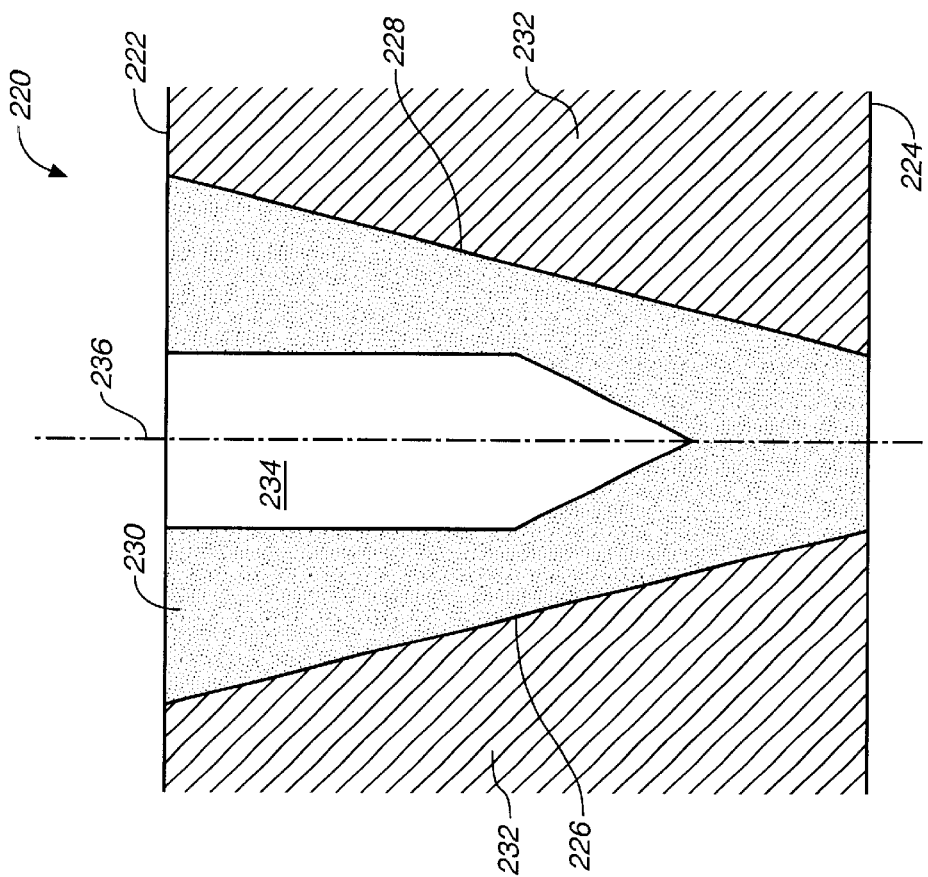
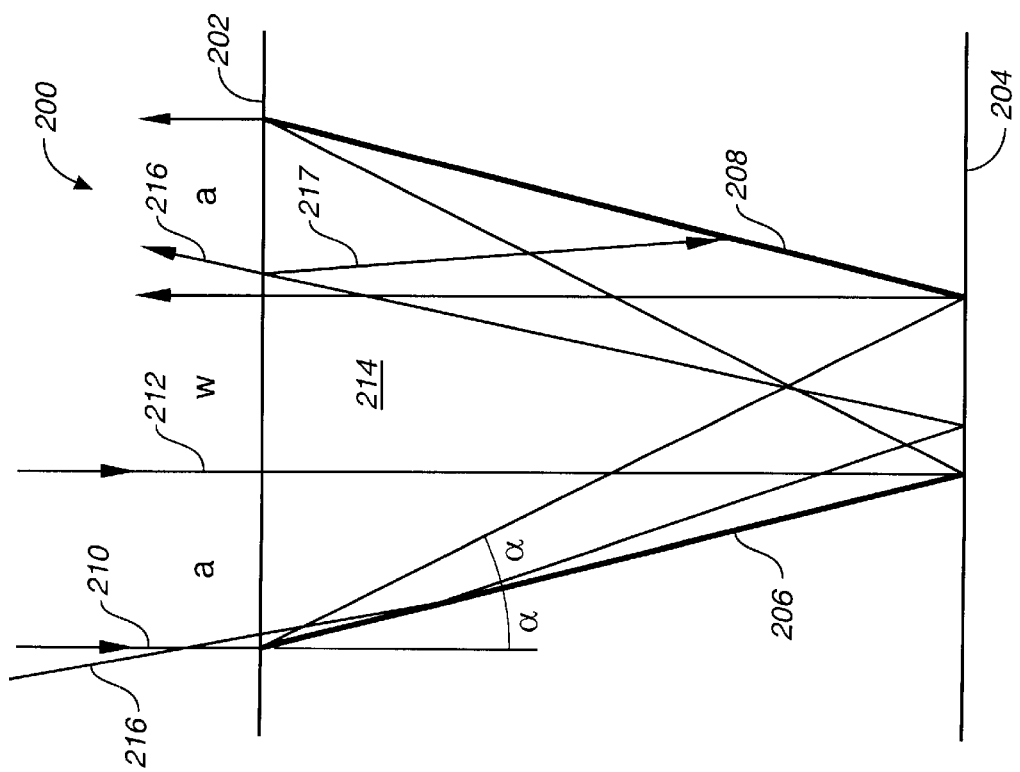
FIG._2A
FIG._2B

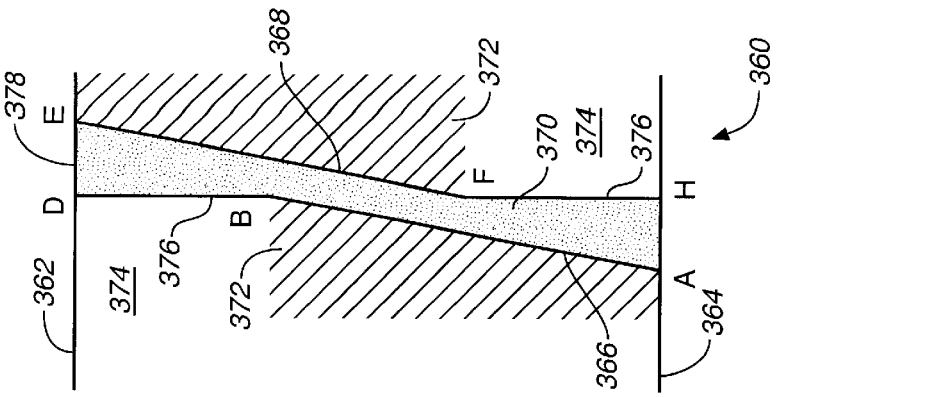
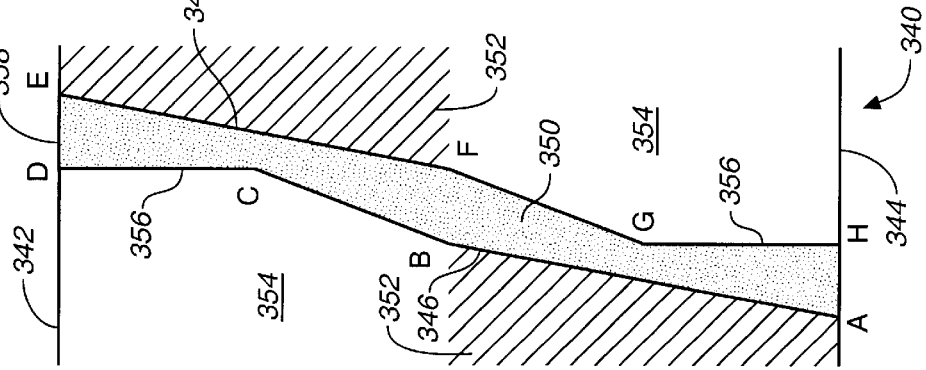
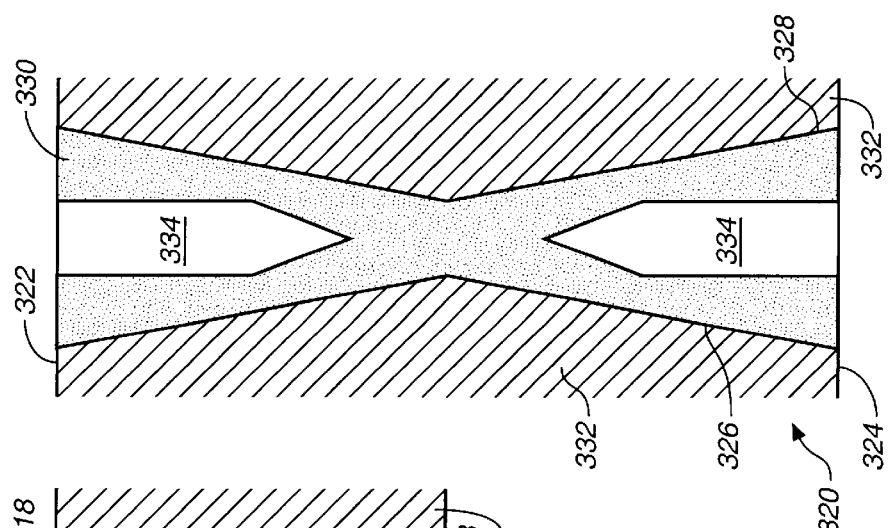
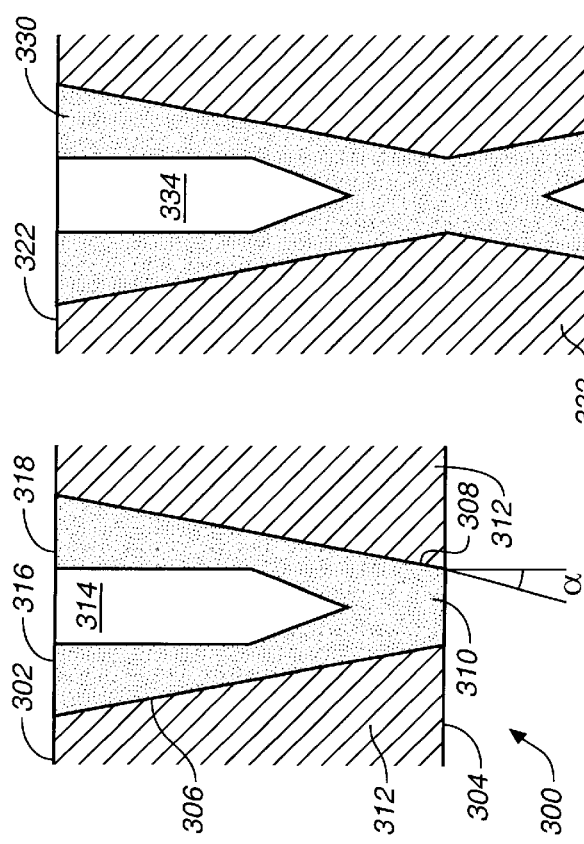

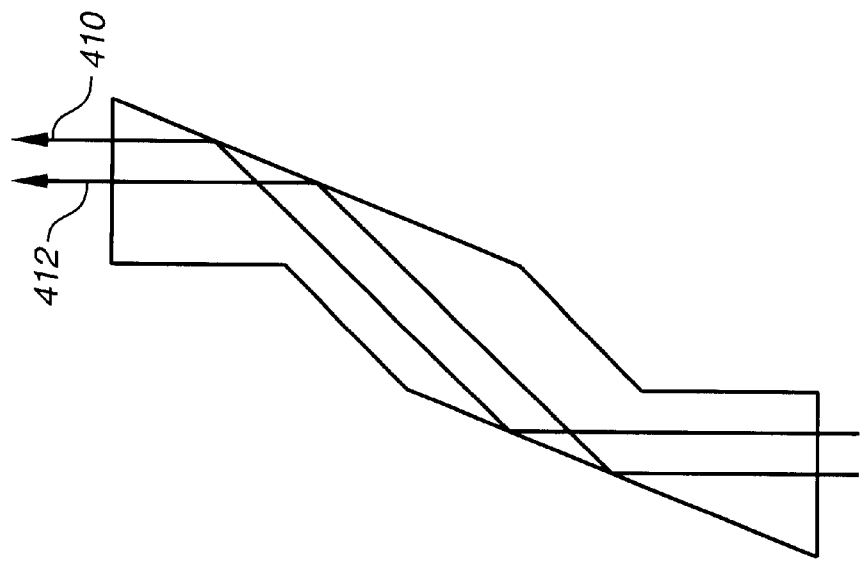
FIG._4C
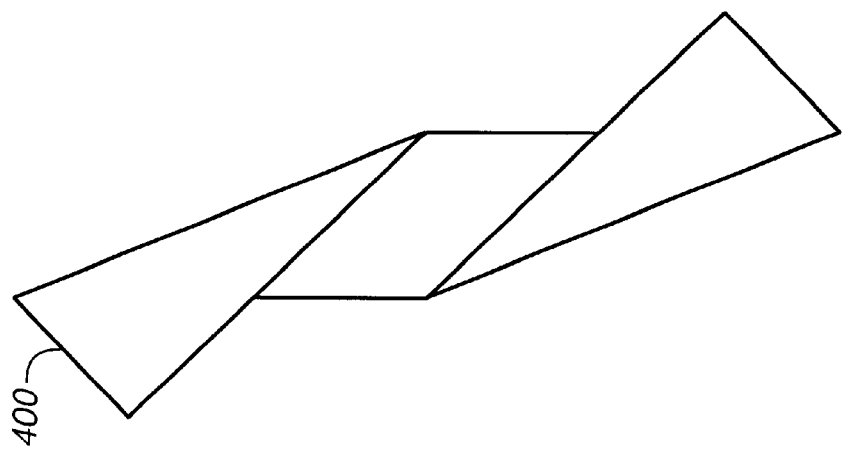
FIG._4B
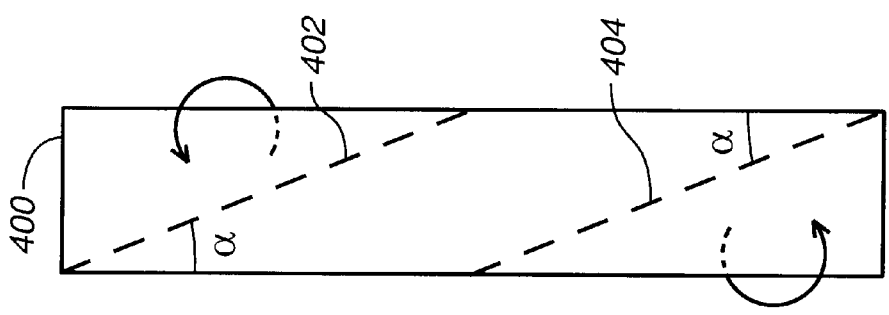
FIG._4A

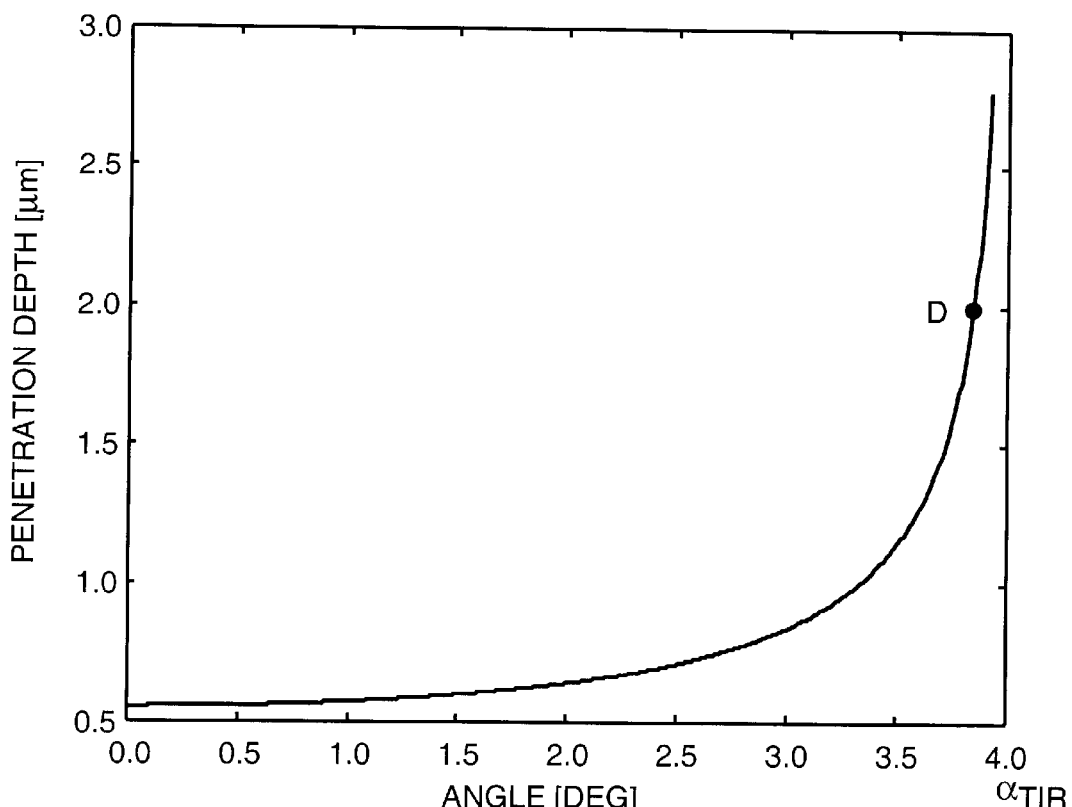
FIG._5
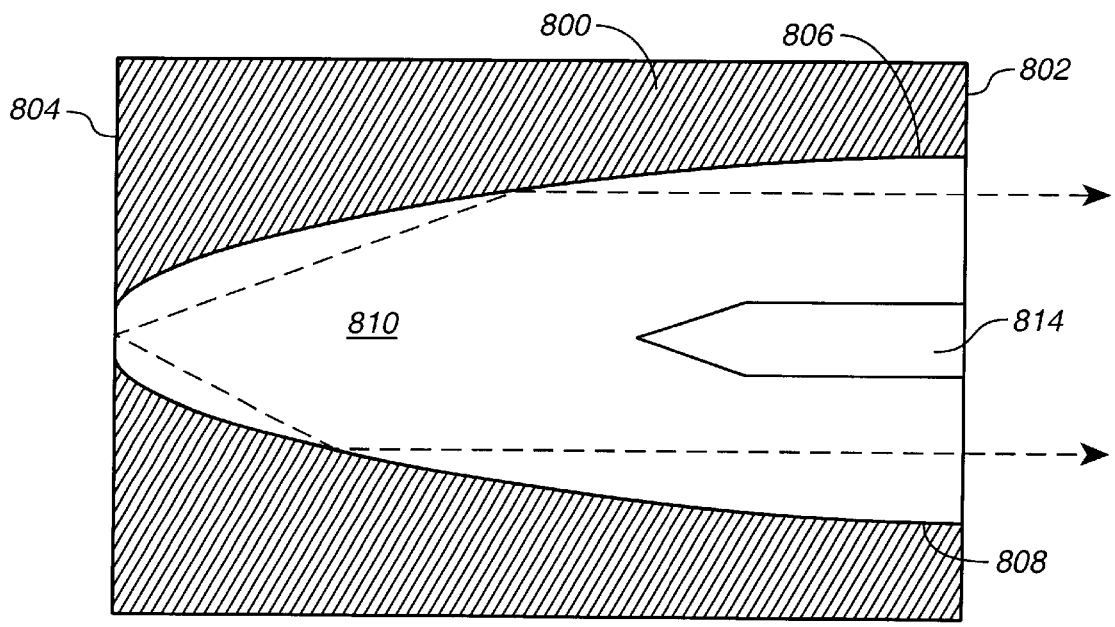
FIG._8

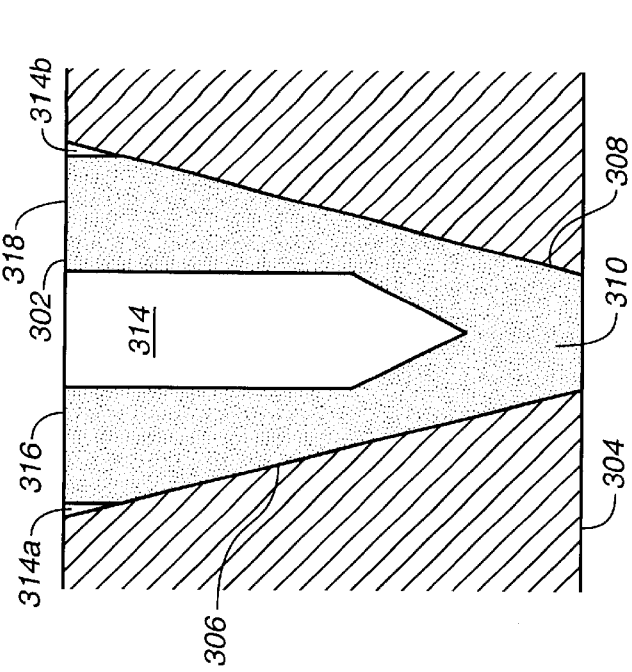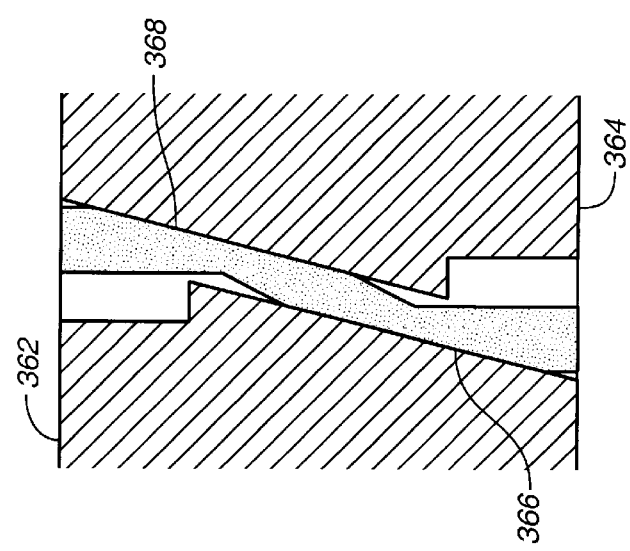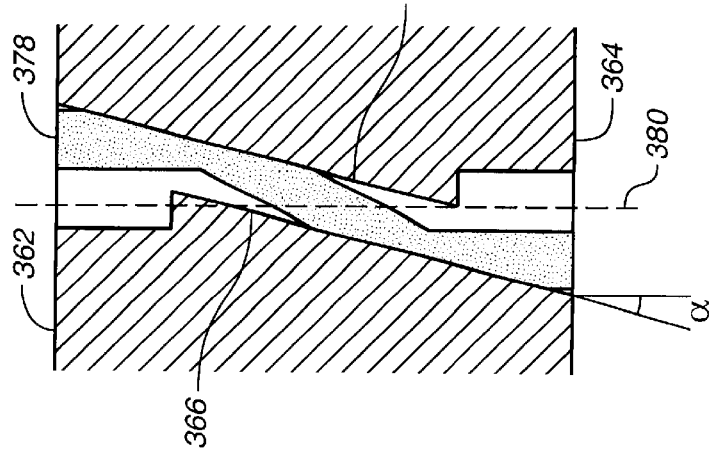

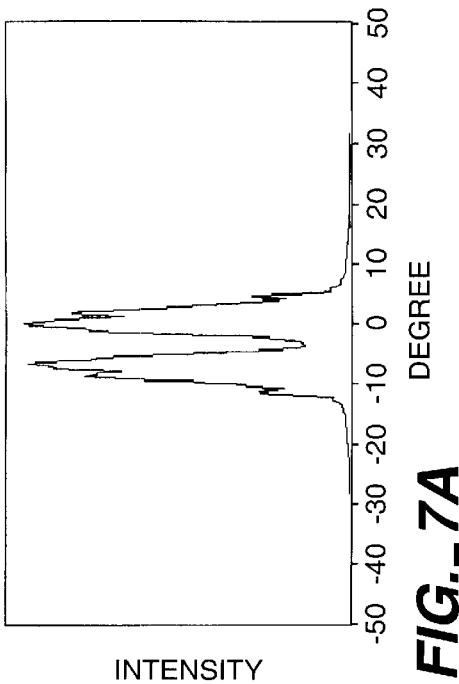
FIG._7A
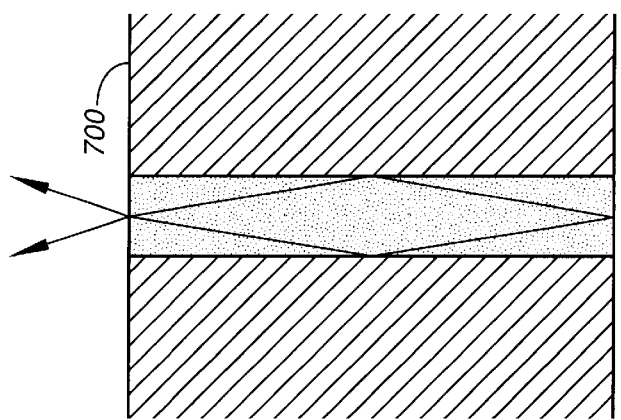
FIG._7B
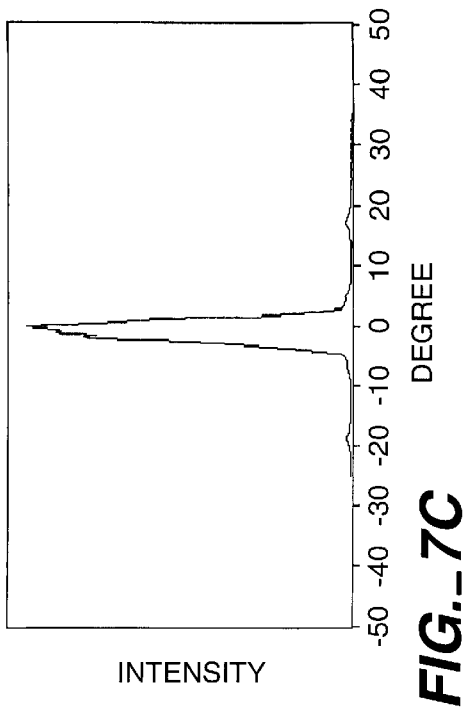
FIG._7C
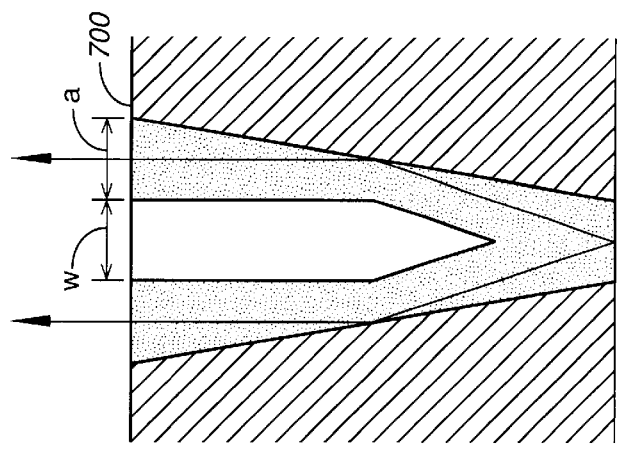
FIG._7D

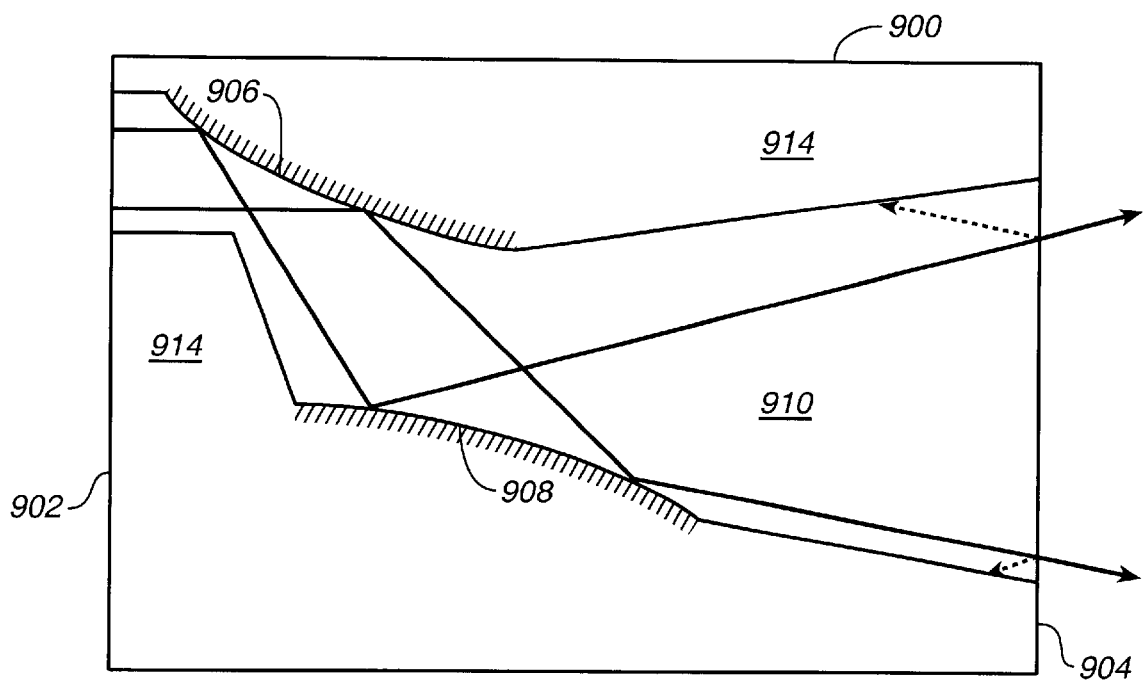
FIG._9
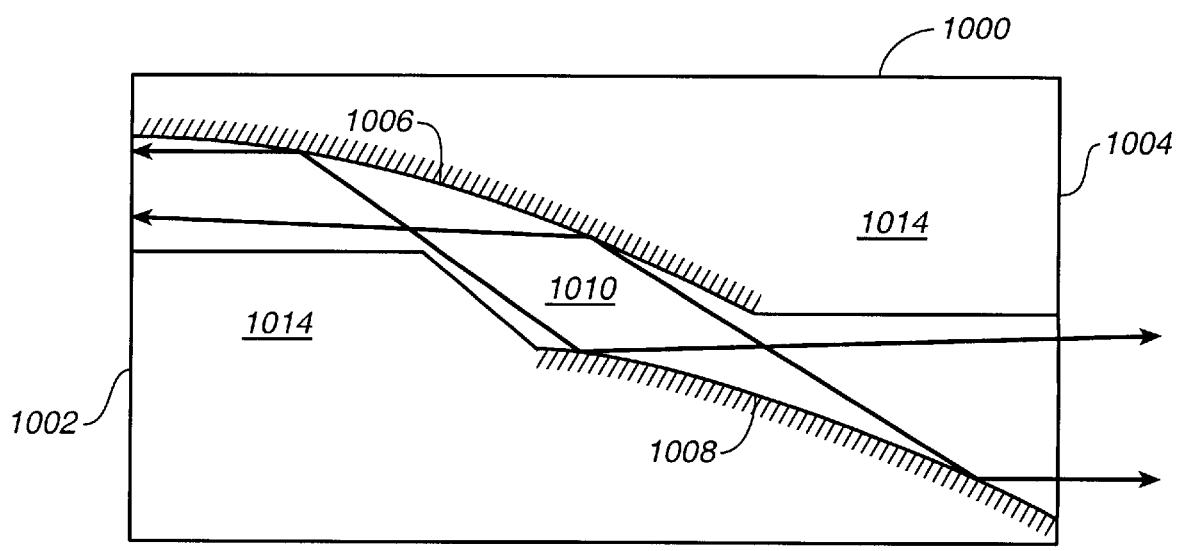
FIG._10

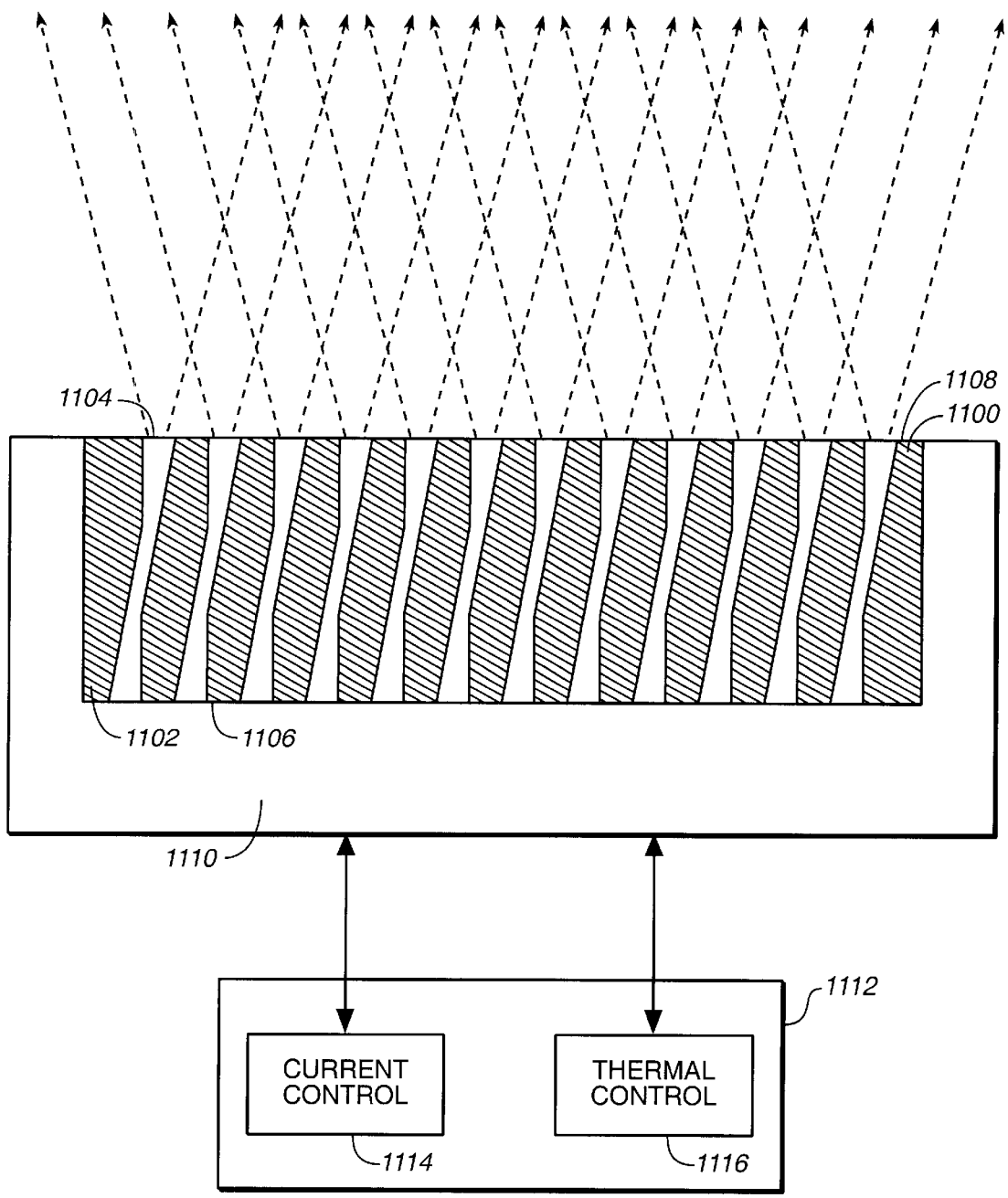
FIG._11

FOLDED CAVITY, BROAD AREA LASER SOURCE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Government Contract No. 70NANB5H1150 awarded by NIST.

FIELD OF THE INVENTION

The invention relates to semiconductor lasers, and more particularly to broad area semiconductor lasers.

BACKGROUND

Most high power semiconductor lasers have broad emitter areas, with the result that the lasers typically operate with multiple lateral modes. The generous dimension tolerances of broad area lasers makes them relatively simple to fabricate at lower cost than high power single spatial mode devices.

Narrow stripe devices normally support a single spatial optical mode, and can provide low to moderate optical powers in a high quality beam whose divergence is typically limited by diffraction. Higher output powers are attainable with wider stripes. However, as the stripe width increases, the ability of the stripe to select a single spatial mode is lost and the beam divergence is no longer limited only by diffraction.

Some methods have been suggested for reducing the divergence of the beam produced by wide apertures, including the integration of narrow stripe lasers with flared amplifiers, the incorporation of strong spatial filters, and elaborate schemes of coupled arrays. These solutions all suffer from drawbacks such as astigmatic output, poor efficiency, and high cost.

The figure of merit for broad area lasers is the brightness, which is proportional to the emitted power divided by the product of the aperture width and lateral divergence angle. The product of the aperture width and lateral divergence is referred to as étendue. Thus, brightness is equal to the emitted power divided by the étendue. For a given aperture width, improved brightness can be achieved by increasing the output power and/or by reducing the lateral beam divergence. There is interest in improving the brightness of simple broad area lasers by reducing the lateral divergence angle, especially if this can be accomplished at no extra manufacturing cost.

Present multimode broad area laser sources may be index-guided or gain guided. The index-guided laser generally includes a broad rectangular current injection stripe confined at the stripe ends by two oscillator mirrors, and laterally confined by lower refractive index material. The other type of multimode broad area source is the gain-guided broad area laser, which differs from the index-guided laser in that there is no lateral confinement by lower index material.

Broad area laser sources typically oscillate along those light paths that experience the highest round-trip gain. The index-guided broad area laser generally oscillates in a number of ring modes, since the light path of the ring mode through the gain area is longer, experiencing higher gain than the straight-path modes traveling the shortest path between the mirrors.

The gain-guided broad area laser does not support ring modes and, therefore, oscillates in modes traveling the shortest path between the mirrors. This results in a single-lobed output. However, the counterpropagating standing wave modes produce spatial carrier hole burning and the formation of self focusing filaments. These filaments have little or no phase correlation with each other and, therefore, result in both phase and amplitude variations in the lateral direction. Because the gain guided laser has no built-in spatial mode filter, the lateral beam divergence increases with increasing power.

Therefore, there is a need for a broad area semiconductor laser source that provides for lower lateral divergence operation, and which produces a higher brightness output than is found in current multimode broad area lasers.

SUMMARY OF THE INVENTION

Generally, the present invention relates to a broad stripe laser having a folded cavity. The folded cavity permits the laser to produce output powers into a high quality beam with low divergence.

In one particular embodiment of the invention, a laser source has a cavity and includes a first material portion having a first refractive index and a second material portion having a second refractive index which forms forming a first interface with the first material portion. The first interface is disposed within the cavity so that divergence of an intracavity light beam propagating within the first material portion is changed upon reflection from the interface.

In another particular embodiment of the invention, a laser source has a cavity and includes a first material region disposed within the cavity and having a first refractive index and a second material region having a second refractive index less than the first refractive index, and forming a first interface with the first material region. The first interface is disposed to reflect a lowest order reflection mode light beam propagating within the first material region. The first interface is disposed at a predetermined angle so that the lowest order reflection mode intracavity light beam is incident on the first interface at an angle below the critical total internal reflection angle, and higher order reflection modes are incident on the first interface at angles in excess of the total internal reflection critical angle.

In another particular embodiment of the invention, a laser source includes a resonant laser cavity and reflective filtering means, disposed within the laser cavity for selectively filtering a reflective mode within the resonant cavity.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 1A shows the output from a conventional gain-guided broad area cavity laser source shown schematically in FIG. 1B;

FIG. 1C shows the output from a conventional index-guided broad area cavity laser source shown schematically in FIG. 1D;

FIG. 1E shows the output from a conventional index-guided broad area cavity laser source having a corrugated interface between the gain material and the low index guiding material shown schematically in FIG. 1F;

FIG. 2A illustrates the reflection path in the optical resonant cavity of a broad area cavity laser source for light beam paths in a tapered, index guided waveguide cavity;

FIG. 2B schematically illustrates a first embodiment of a folded cavity laser source according to the present invention;

FIG. 3A schematically illustrates a second embodiment of a folded cavity laser source according to the present invention;

FIG. 3B schematically illustrates a third embodiment of a folded cavity laser source according to the present invention, incorporating a double-ended structure;

FIG. 3C schematically illustrates a fourth embodiment of a folded cavity laser source according to the present invention, incorporating a single-folded structure;

FIG. 3D schematically illustrates a fifth embodiment of a folded cavity laser source according to the present invention, incorporating a reduced-length, single-folded structure;

FIG. 4A is a first of three figures schematically demonstrating a folded cavity of the present invention where the "old" is established;

FIG. 4B illustrates the cavity of FIG. 4A after the "fold" has been made;

FIG. 4C shows the orientation of the cavity of FIG. 4B in the longitudinal direction of the laser cavity;

FIG. 5 illustrates a graph showing the penetration depth of the optical field into a lower refractive index medium as a function of incidence angle;

FIGS. 6A–6C schematically illustrate additional embodiments relative to the broad area cavity laser source according to the present invention;

FIGS. 7A and 7C respectively show the far-field angular distribution emitted from an index-guided rectangular cavity, broad area laser as schematically illustrated in FIG. 7B and an index-guided, folded cavity, broad area laser schematically illustrated in FIG. 7D;

FIG. 8 schematically illustrates another embodiment of a folded cavity according to the present invention including a folded cavity arrangement with curved index walls;

FIG. 9 schematically illustrates a further embodiment of a folded cavity according to the present invention including a folded cavity arrangement with curved index walls forming an unstable resonator;

FIG. 10 schematically illustrates another embodiment of a folded cavity according to the present invention including a folded cavity arrangement with curved index walls forming a telescopic cavity arrangement; and FIG. 11 schematically illustrates an array of folded cavity lasers according to an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to semiconductor lasers having broad output areas. One of the advantages of the invention is that the lasers can produce high output powers with lower divergence than conventional broad area lasers. The following discussion is presented in terms of the semiconductor laser, but there is no intention to limit the invention to semiconductor lasers.

First, it is important to examine how high powers and improved beam brightness is achieved in laser source design. High power requires large mode volume and large output apertures. This has been traditionally accomplished by choosing a sufficient length and width for the cavity design which, for semiconductor lasers, typically has a rectangular cross-sectional form. The simplest cavities lack a lateral index-guiding mechanism for the optical mode. In these cases, the mode is weakly guided by refractive index variations due to lateral variations in carrier density. Such a laser source 100 is illustrated in FIG. 1B. The propagating modes oscillate between the end facets 102 and 104 of the laser source 100 with little waveguiding support from the lateral cavity boundaries. Unfortunately, such a laser tends to form self-focusing light filaments 106 that have little or no phase correlation with one another. The resulting far-field output beam pattern 110 in the lateral direction is illustrated in FIG. 1A. The beam pattern 110 is characterized by a broad, irregularly shaped or roughened contour, single lobe due to multiple filaments creating different intensities along the wavefront of the output beam 108. Furthermore, the divergence angle from light produced by a single, narrow filament is significantly larger than the diffraction-limited divergence associated with the output aperture An index-guided rectangular cavity 120 is illustrated in FIG. 1D. The cavity 120 is formed between two end facets 122 and 124, and cavity sidewalls 126 and 128 are formed by an index-guiding material having a refractive index lower than the gain region 130. Angled, or diagonally formed, modes 132 are supported by total internal reflection (TIR) along the cavity sidewalls 126 and 128. The angled modes 132 reflect at different angles within the gain region 130, reflecting from the sidewalls 126 and 128 to circulate, for example, in a ring within the cavity formed by the end facets 122 and 124 and the sidewalls 126 and 128. The ring-like modes 132, therefore, have longer gain paths in the cavity compared to straight-path modes that propagate directly between the end facets 122 and 124 without reflection. The ring-like modes 132 and the straight-path modes spatially overlap, resulting in gain competition between the ring and straight-path modes. The ring-like modes dominate, since they have a higher overall gain, resulting in significant suppression of filaments. Therefore, the output profile 134 from the cavity 120 is typically not as rough or irregular as the profile 110 illustrated in FIG. 1A. However, the angled ring modes 132 result in a wide, double-lobed lateral far-field output beam pattern 134, for example as illustrated in FIG. 1C. The lobes of the far-field pattern 134 are sometimes referred to as "bat ears". It is often desirable to suppress these lobes in order to provide for a more uniform, far field lateral beam profile, and to allow the output beam to be more focusable.

Where the reflecting sidewalls 126 and 128 are sufficiently close to each other, the ring modes may be suppressed, and the cavity 120 operates on a single lateral mode. When this is the case, the laterally diverging output from the cavity 120 is diffraction limited. However, single mode operation occurs only when the separation between the index-guiding sidewalls is of the order of just a few wavelengths, thus severely restricting the amount of power that can be extracted from the cavity. As the separation between the sidewalls increases, the étendue also increases, not only because the emitting area increases, but also because the lateral divergence of the output beam increases. Assuming a constant power emitted per unit area of the emitter, then the laser brightness decreases with increased sidewall separation, since the divergence increases.

The lobed pattern may be suppressed by disturbing the TIR on the sidewalls of the cavity. The cavity 140 illustrated in FIG. 1F has a gain region 150 positioned between two end facets 142 and 144. The sidewalls 146 and 148 are corrugated, or otherwise arranged, to reduce the build-up of ring-like modes that depend on TIR off the sidewalls 146 and 148. The resultant lateral far-field output beam pattern 154, illustrated in FIG. 1E, exhibits less pronounced side lobes and has a lower divergence angle. However, the introduction of the corrugated sidewalls 146 and 148 increases the scattering loss, resulting in reduced laser efficiency. Also, there is an increased likelihood of oscillating in a filamentary straight-path mode because the highest gain ring modes are suppressed, and gain competition is reduced.

The present invention includes a new wide area cavity laser source that employs a folded cavity. Advantages of the invention are that the occurrence of bat ears is reduced, and the laser is less likely to oscillate in a filamentary mode. Importantly, the lateral far-field divergence is reduced, thus increasing the laser's brightness.

A folded cavity is a resonant cavity that is not rectangularly shaped in form. The basis for such a cavity geometry is explained with reference to FIG. 2A which schematically shows a laser cavity 200 formed between two cavity reflectors 202 and 204. The cavity 200 also includes two reflecting surfaces 206 and 208 set at an angle α relative to the cavity reflectors 202 and 204.

The two traced rays 210 and 212 define the lowest order reflected mode. The first ray 210 is incident on the first reflecting surface 206 close to the first cavity reflector 202. The first ray 210 is reflected off the first reflecting surface at an angle a, and is incident on the end cavity reflector 204 before reflecting off the second reflecting surface 208. Consequently, the ray 210 is incident on the first cavity reflector 202 in a direction antiparallel to its input direction.

The second ray 212 is incident on the first reflecting surface 206 close to the second cavity reflector 204. The second ray 212 is reflected off the first reflecting surface 206 at an angle α, and is incident on the second cavity reflector 204. The second ray 212 then reflects off the second reflecting surface 208 at a point close to the first cavity reflector 202. Consequently, the second ray 212 is incident on the first cavity reflector 202 in a direction antiparallel to its input direction.

On passing through the first cavity reflector 202, the first and second rays 210 and 212 are separated by a distance "a". It will be appreciated that there exists a lowest order reflection mode described by parallel rays that enter the first cavity reflector between the first and second rays 210 and 212. Accordingly, the first and second rays may be understood as representing the outer edges of the lowest order reflection mode. Higher order reflection modes exist where the rays reflect off more than just one of the reflecting surfaces on each pass through the cavity. Consequently, the higher order modes are incident on the sidewalls at higher angle than the lowest order reflection mode.

The points on the first cavity reflector 202 where the second ray enters and exits the first cavity reflector are separated by the distance "w". It will be appreciated that the separation distance "w" is dependent, at least in part, on the separation between the reflecting surfaces 206 and 208.

In a semiconductor laser, the reflecting surfaces 206 and 208 may be formed by interfaces between different semiconductor materials having different refractive indices. Typically, the interface is between the gain material, having a refractive index, $n_1$, and the index-guiding material, having a refractive index, $n_2$, where $n_2 < n_1$. The reflector angle, α, is smaller than $α_{TIR}$ where $α_{TIR}$ is the critical angle for total internal reflection. The value of $α_{TIR}$ depends on the difference in refractive index between the materials forming the interfaces. The critical angle is given by the expression $α_{TIR} = \cos^{-1}(n_2/n_1)$. In index-guided, semiconductor laser sources, $α_{TIR}$ is generally less than 5°. Therefore, the angle, α, is usually small.

The intermediate area 214 between the trace paths, which does not overlap the lowest order reflection mode, need not be a gain region. In fact, it may be advantageous for the intermediate area 214 to be somewhat absorbing in order to increase the losses of the straight-path modes. The intermediate area 214, also referred to as a non-gain region, may be formed from the same material as the gain region but having no current injection to create gain. The non-gain region 214 may also be formed of a material different from that of the gain region. The non-gain region 214 may be formed to absorb light at the oscillation wavelength.

One particular embodiment of a laser 220 incorporating a folded cavity is illustrated in FIG. 2B. The laser 220 includes reflecting facets 222 and 224 and a gain region 230 between the reflecting facets 222 and 224. The laser 200 also includes two angled reflecting sidewalls 226 and 228 formed at the interface between the material of the gain region 230 and the material of an index-guiding material 232 having a refractive index lower than the refractive index of the gain material. A non-gain region 234, may be formed from the same material as the gain region, but is not injected with carriers, and therefore shows no gain at the oscillating wavelength. The non-gain region 234 may also be an absorbing region.

Of significant importance in selecting the lowest order reflection mode is the proper choice of the reflector angle, α. If the reflector angle, α, is chosen to be close to, but smaller than, the maximum TIR angle, then a beam incident on the sidewalls 206 and 208 at an angle significantly larger than α is not totally internally reflected, and suffers high losses. On the other hand, a ray, for example ray 216, incident on a sidewall 206 or 208 at an angle significantly smaller than α does not circulate on a round trip and therefore has high loss. Also, reflected ray 217 may be incident on the sidewall 208 at an angle greater than the critical angle. In many cases, such beams may also be absorbed in the non-gain region 214.

It will be appreciated that the laser 220, and various other embodiments described below, may be provided with reflective coatings to optimize the laser output. For example, the rear facet 224 may be provided with a highly reflective coating to reduce the amount of light output in the backwards direction. The front facet 222 may be provided with an antireflective coating to reduce reflectivity to a low level in order to increase the amount of light output by the laser 220 to an optimum level. It will also be appreciated that the light propagating within the laser 220 may be vertically confined within a waveguide.

The cavity geometry of FIG. 2B produces a device that has a front facet with two wide apertures and a single rear facet that functions primarily as a reflector due to the angle of the light reaching the facet. However, the cavity geometry may be modified to be a single, wide aperture emitter output.

FIGS. 3A–3D disclose different embodiments of cavity geometry where $α < α_{TIR}$. The embodiment 300 illustrated in FIG. 3A is similar to that shown in FIG. 2B, and has a front facet 302, a rear facet 304, an intermediate gain region 310, and a non-gain region 314. There are two front facet emitting areas 316 and 318. The hatched regions 312 represent lower refractive index regions, and the interfaces between the low index regions 312 and the gain region 310 form the reflecting sidewalls 306 and 308.

Another embodiment of the folded cavity 320 is illustrated in FIG. 3B. The cavity 320 may be regarded as being similar to the cavity 300 of FIG. 3A, but with an additional mirror image portion added to the lower half. This may also be regarded as "unfolding" the cavity 300 of FIG. 3A at the rear facet 304.

The double-ended, X-shaped cavity 320 is formed between two facets 322 and 324, having a gain region 330 with sidewalls 326 and 328 lying on either side of the gain region 330. The sidewalls are formed by the interface between the materials of the gain region 330 and a low refractive index region 332. Non-gain regions 334 are positioned to extend into the cavity from each of the facets 322 and 324.

The cavities 300 and 320 each have two apertures at the output facets 302 and 322 respectively. It may be advantageous for the folded cavity to have only one output aperture, for example to enhance focusability of the beam. Another embodiment of a folded cavity 340, having a single output aperture, is illustrated in FIG. 3C. The cavity 340 is formed between two facets 342 and 344, having a gain region 350 and sidewalls 346 and 348 lying on either side of the gain region 350. The sidewalls 346 and 348 are formed by the interface between the materials of the gain region 350 and low refractive index regions 352, shown as hatched regions. Non-gain regions 354 are positioned to extend into the cavity from each of the facets 342 and 344. The non-gain regions 354 are separated from the gain region 350 by interfaces 356. The cavity 340 has an output aperture 358 and may be regarded as including one half of the "X" shaped cavity 320 of FIG. 3B.

Some regions of the cavity 340 may be index-guided while other regions are gain-guided. For example, sidewalls 346 and 348 may provide index-guiding along lines A-B and E-F. The interfaces 356 may provide gain-guiding along lines B-C-D and F-G-H.

The maximum width of the aperture, the separation between points D and E, is limited for a given cavity length, since α is typically small. The aperture-to-length ratio may be increased by reducing the cavity length along the parallel lines B-C and F-G. In principle, the cavity length can be compressed so that point B meets point C while point G meets point F resulting in the more compact geometry (shorter cavity length) shown in FIG. 3D.

The single aperture, folded cavity 360 illustrated in FIG. 3D is formed between two facets 362 and 364, having a gain region 370 and sidewalls 366 and 368 lying on either side of the gain region 370. The sidewalls 366 and 368 are formed by the interface between the materials of the gain region 370 and low refractive index regions 372, shown as hatched regions. Non-gain regions 374 are positioned to extend into the cavity from each of the facets 362 and 364. The non-gain regions 374 are separated from the gain region 370 by interfaces 376. One of the advantages of this embodiment is that it provides a relatively high aperture/length ratio.

It will be appreciated that the embodiments illustrated in FIGS. 3B–3D are related to the embodiment illustrated in FIG. 3A. The embodiment of FIG. 3B may be derived by "unfolding" a mirror image of the embodiment of FIG. 3A about the rear facet 304. The embodiment of FIG. 3C may be derived by selecting one of the "arms" of the X-shaped cavity 320 illustrated in FIG. 3B. The embodiment of FIG. 3D may be derived by shortening the cavity of the embodiment of FIG. 3C in a direction parallel to the lines BC and FG.

An alternative approach to understanding the folded cavity design is described with reference to FIGS. 4A–4C. A rectangular cavity 400 is illustrated in FIG. 4A. The cavity 400 is folded along the two dashed lines 402 and 404 set at an angle α. The two folds 402 and 404 originate in diagonally opposite corners of the cavity 400. The angle α is selected to be close to, but less than $\alpha_{TIR}$. FIG. 4B shows the folded cavity 400. This cavity geometry provides for suppression of higher order modes as well as straight-path modes between the end facets. The only light propagating through the folded cavity includes rays at about 2α, of which two rays 410 and 412 are shown in FIG. 4C. The light rays 410 and 412 cross each other at least twice in the cavity. Therefore, the two rays compete for the same carriers, suppressing the development of self focusing filaments. One of the advantages of the folded cavity geometry is that the output beam has a reduced lateral divergence compared to a rectangular cavity having the same aperture, and can operate at high output powers.

The cavity designs of FIGS. 3A–3D may be modified in order to achieve optimum operation. For example, it may be important to take into consideration the diffraction of light and the penetration depth into the lower refractive index material. This latter effect results from the fact that the TIR of the light beams does not take place precisely along the line of the refractive index interface along the sidewalls. Rather, the light penetrates into the sidewall by a finite amount, effectively shifting the line at which reflection takes place. This shift may be compensated by moving the sidewalls inwardly towards the cavity axis by an amount equal to the penetration depth of the light into the low index material.

FIG. 5 shows a plot of the depth that light penetrates into a TIR surface as a function of angle, α. The TIR angle, $\alpha_{TIR}$, is set at 4°. For angles significantly smaller $\alpha_{TIR}$, the penetration depth is less than 1 μm and changes with incidence angle only slowly. For angles close to $\alpha_{TIR}$, the penetration depth rapidly approaches infinity. The angle of incidence for the lowest order reflection mode may be selected to be about 3.5°, near point D, where the penetration depth is about 2 μm. Since the higher order reflection modes are incident on the sidewalls at a higher angle than the lowest order mode, the higher order modes typically have an angle of incidence greater than 4°. For such large angles, there is no TIR, and so light in the higher order modes is lost through the sidewalls. This provides an efficient cut-off for filtering out higher order reflection modes.

It is also important to note that light propagating within the cavity does not travel in infinitely narrow, precise parallel rays, for example as illustrated in FIG. 4C. Diffraction causes some of the light reflected from one of the sidewalls to pass in front of the other sidewall, thus producing small side lobes in the lateral far-field output intensity distribution that may be seen in FIG. 7C. The small side lobes may be reduced by introducing a small redirecting region 314a and 31b close to the outer aspect of the output apertures 316 and 318 respectively, illustrated in FIG. 6C.

Other steps may be taken to enhance the operation of the cavity. FIGS. 6A and 6B show cavities similar to that of FIG. 3D. The first sidewall 366 extends closer to the first facet 362 than the embodiment of FIG. 3D, and the second sidewall 368 extends closer to the second facet 364. Also, the embodiment illustrated in FIG. 6B shows a reduced spacing between the sidewalls 366 and 368. The extension of the sidewalls 366 and 368 towards the end facets, and the reduction in the separation between the sidewalls 366 and 368 reduces the possibility that straight-path modes, such as indicated by dotted line 380, oscillate in the cavity. The embodiment of FIG. 6B has an increased aperture/length ratio over that of the embodiment of FIG. 6A.

FIGS. 7A–7D illustrate a comparison between a conventional rectangular cavity and a cavity fabricated according to the present invention. FIG. 7A shows the lateral far-field output intensity profile generated by a conventional, rectangular cavity, broad stripe laser 700, schematically illustrated in FIG. 7B. The width of the stripe was about 90 μm. The laser 700 operated in a wide-angle ring mode, as described above with reference to FIGS. 1C and 1D.

The lateral far-field output intensity profile of a folded cavity laser is illustrated in FIG. 7C. The folded laser cavity 710 is schematically illustrated in FIG. 7D. The width, a, of each of the output stripes 712 was about 90 μm. The folded cavity laser 710 operated at powers up to 3W into a single lobe having a FWHM divergence of about 5°. Thus, the folded cavity laser produced about 0.6 W/degree of lateral divergence. The folded cavity laser 710 had the same differential efficiency as the rectangular cavity laser 700, but had a laser output beam divergence about three times less than that of the rectangular cavity laser 700.

Additional embodiments, which include curved index-guiding sidewalls, are now described. An advantage provided by curved index-guiding walls is that the size and/or divergence of the lowest reflection mode may be changed following reflection from one or more curved sidewalls.

In FIG. 8, the folded cavity laser 800 includes a front facet 802 and a rear facet 804, with a gain region 810 between the facets 802 and 804. The laser 800 has curved index-guiding sidewalls 806 and 808 that can be formed, for example using a mesa or channeled substrate to offset the laser growth to form an index change in the active region, by impurity induced disordering, or other suitable methods. The sidewalls 806 and 808 may operate as a brightness conserving light duct and may, for example, assume the profile of a compound parabolic concentrator, a truncated parabolic concentrator or such other shape that reduces the angle of divergence of light that is scattered off the sidewalls 806 and 808. The laser 800 may be provided with a non-gain region 814 to reduce oscillation of straight-path modes.

In FIG. 9, the folded cavity laser 900 includes first and second facets 902 and 904, and a gain region 910. Curved index-guiding sidewalls 906 and 908 enable the laser 900 to operate as an unstable resonator. The laser 900 may also include non-gain regions 914 that preferably absorb light at the oscillation wavelength. Light within the laser propagates to the second facet 904. Some of the light is transmitted as an output beam 920, while other portions of the light, such as light 921, are reflected at the second facet 904 to be lost into the non-gain region 914. The unstable resonator configuration may permit the laser to produce a diffraction limited output beam.

FIG. 10 illustrates a telescopic folded cavity laser 1000, having first and second facets 1002 and 1004, curved sidewalls 1006 and 1008, and a gain region 1010 between the facets 1002 and 1004. One of the sidewalls is convex, while the other is concave. The index-guiding sidewalls 1006 and 1008 form a telescope image that provides for a wide aperture laser with a comparatively small far field lateral divergence angle. The width of the intracavity light beam incident on the second facet 1004 is larger than the width of the beam on the first facet 1002. Non-gain regions 1014 may be provided to prevent the build-up of straight-path modes.

The first facet 1002 may be provided with a high reflecting coating while the second facet 1004 is provided with a low reflecting coating, thus forming a broad area folded cavity laser that has a significantly narrow lateral divergent output. Index-guiding sidewalls may be selectively formed through the employment of channeled substrates prior to device growth or by impurity induced disordering after device growth.

An array of folded cavity lasers is illustrated in FIG. 11. The laser array 1100 includes a semiconductor chip 1102 having a plurality of folded cavity stripes 1104. The chip 1102 may be provided with a highly reflecting coating on the rear facet 1106, and an anti-reflective coating on the output facet 1108 to optimize power output from the laser array 1100. The laser array 1100 may be disposed on a mount 1110 that provides cooling in order to maintain the array 1100 at a stabilized temperature when the laser 1100 is operating. The mount 1110 may be thermoelectrically cooled, liquid cooled, conductively cooled, cooled by any combination of the preceding three approaches, or by any other suitable cooling method. The laser array 1100 may be a one dimension array, for example a plurality of emitters arranged in parallel on a single chip as illustrated, or may be a two dimensional array, for example an arrangement of two or more chips stacked together.

The laser array 1100 may be attached to a controller 1112, which controls the operation of the array 1100. The controller 1112 may include a current controller 1114 to control the current passing through the array 1100, and hence its output power. The current controller 1114 may be operated to stabilize the current passing through the laser array 1100, or may be operated to stabilize the power output by the laser array 1100. The controller 1112 may also include a thermal controller 1116 to control the operating temperature of the array 1100. The thermal controller 1116 may be adapted to control the cooling provided to the array 1100 by the mount 1110. For example, if the mount 1110 provides thermoelectric cooling, then the thermal controller may control the amount of current passing through the thermoelectric cooler in order to control the amount of heat extracted from the array 1100 by the thermoelectric controller.

It should be appreciated that a single folded cavity laser may also be operated by a controller having a current controller and/or a thermal controller.

As noted above, the present invention is believed to be applicable to broad area semiconductor lasers. The invention is believed to be particularly useful in high power laser applications that require a high quality output beam.

Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices

We claim:

1. A laser source having a cavity formed between two reflecting end facets, comprising:

a first material region disposed within the cavity and having a first refractive index; and a second material region having a second refractive index less than the first refractive index, and forming a first interface with the first material region, the first interface intersecting said two reflecting end facets at a predetermined acute angle greater than 0° and less than 90°, so that a lowest order reflection mode intracavity light beam is incident on the first interface at an angle below a critical total internal reflection angle associated with the interface, and higher order reflection modes are incident on the first interface at angles in excess of the total internal reflection critical angle, and further comprising a non-gain material region disposed in direct line between the end facets, so that all straight-path cavity modes pass through the non-gain region.

2. A laser source as recited in claim 1, further comprising a third material region having a third refractive index less than the first refractive index and forming a second interface with the first material region, the second interface being disposed to reflect the lowest order reflection mode light beam propagating within the first material region.

3. A laser source as recited in claim 2, wherein the second material is the same as the third material.

4. A laser source as recited in claim 2, wherein the first and second interfaces are formed at different acute angles greater than 0° and less than 90° relative to a cavity axis orthogonal to said two reflecting end facets.

5. A laser source as recited in claim 1, further comprising a plurality of gain regions having individual emitting areas to emit individual light beams.

6. A laser source as recited in claim 1, further comprising a cooling mount, the cavity being mounted on the cooling mount to extract heat from the cavity.

7. A laser source as recited in claim 1, further comprising a controller coupled to control operation of the laser source.

8. A laser source as recited in claim 7, wherein the controller is adapted to control output power of the laser source.

9. A laser source as recited in claim 7, wherein the controller is adapted to control an operating temperature of the laser source.

10. A laser source as recited in claim 1, wherein the first material region is disposed in a multi-lateral mode waveguide.

11. A laser source as recited in claim 1, wherein the first interface has a concave curve relative to the lowest order reflection mode.

12. A laser source as recited in claim 1, wherein the first interface has a convex curve relative to the lowest order reflection mode.

13. A laser source having a cavity formed between first and second cavity end reflectors, the laser source comprising:

a first material portion having a first refractive index; and a second material portion having a second refractive index and forming a first interface with the first material portion, the first interface being disposed within the cavity and intersecting said first and second cavity end reflectors at an acute angle greater that 0° and less than 90°, so that divergence of an intracavity light beam propagating within the first material portion is changed upon reflection from the interface, further comprising a non-gain material portion positioned between end reflectors of the cavity, so that all straight-path modes pass through the non-gain region.

14. A laser source as recited in claim 13, wherein the intracavity light beam is confined to a waveguide.

15. A laser source as recited in claim 13, wherein the first material portion is disposed in a multi-lateral mode waveguide.

16. A laser source as recited in claim 13, further comprising a third material portion having a third refractive index less than the first refractive index and forming a second interface with the first material portion, the second interface being disposed to reflect the intracavity light beam.

17. A laser source as recited in claim 16, wherein the material of the third material portion is the same as the material of the second material portion.

18. A laser source as recited in claim 16, wherein the first and second interfaces form first and second reflecting sidewalls respectively, each sidewall essentially curving from one reflector of the cavity to the other reflector of the cavity, the sidewalls being symmetrically spaced about an optical axis of the cavity, one sidewall being a mirror image of the other sidewall relative to the optical axis.

19. A laser source as recited in claim 16, wherein the first and second interfaces each form a concave curved reflecting sidewall for the intracavity light beam.

20. A laser source as recited in claim 16, wherein the first interface forms a concave curved reflecting sidewall and the second interface forms a convex curved reflecting sidewall for the intracavity light beam.

21. A laser source as recited in claim 16, wherein the first and second interfaces each form a convex curved reflecting sidewall for the intracavity light beam.

22. A laser source as recited in claim 16, wherein the reflected intracavity light beam has a first width at a first cavity end reflector and has a second width at a second cavity end reflector different from the first width.

23. A laser source as recited in claim 13, further comprising a plurality of gain regions having individual emitting areas to emit individual light beams, and the first interface is disposed within a cavity associated with one of the gain regions.

24. A laser source as recited in claim 13, further comprising a cooling mount, the cavity being mounted on the cooling mount to extract heat from the cavity.

25. A laser source as recited in claim 13, further comprising a controller coupled to control output power of the laser source.

26. A laser source as recited claim 25, wherein the controller is adapted to control operating temperature of the laser source.

27. A laser source, comprising:

a resonant laser cavity formed between first and second cavity end reflectors and;

reflective filtering means, disposed within the laser cavity, said reflecting filter means including a reflection interface between materials of respectively different refractive indices, said reflection interface intersecting said first and second cavity end reflectors at an acute angle greater that 0° and less than 90° for selectively filtering a reflective mode within the resonant cavity, and further including light absorbing means positioned within the cavity for absorbing light in all direct-line modes propagating between ends of the cavity.

28. A laser source as recited in claims 27, wherein the reflective filtering means includes reflecting surface.

* * * * *